United States Patent [19]

Koyama et al.

[11] Patent Number: 4,624,735
[45] Date of Patent: Nov. 25, 1986

[54] CONSTITUENT MEMBERS OF A SEMICONDUCTOR ELEMENT-MANUFACTURING APPARATUS AND A REACTION FURNACE FOR MAKING SAID CONSTITUENT MEMBERS

[75] Inventors: Masao Koyama, Oguni; Syuitu Matuo, Atsugi; Chiaki Nakayama, Ebina; Katsumi Hoshina, Oguni, all of Japan

[73] Assignee: Toshiba Ceramics Co., Ltd., Tokyo, Japan

[21] Appl. No.: 701,641

[22] Filed: Feb. 11, 1985

Related U.S. Application Data

[60] Continuation of Ser. No. 421,025, Sep. 22, 1982, abandoned, which is a division of Ser. No. 162,943, Jun. 25, 1980, Pat. No. 4,424,193.

[30] Foreign Application Priority Data

Jul. 9, 1979 [JP]  Japan ................................ 54-86708

[51] Int. Cl.$^4$ ............................................ C30B 35/00
[52] U.S. Cl. .................................... 156/610; 427/93; 156/DIG. 83; 423/345
[58] Field of Search ........ 156/610, DIG. 64, DIG. 83; 422/247, 245, 248, 240; 423/345; 118/726, 728; 427/93

[56] References Cited

U.S. PATENT DOCUMENTS

| | | | |
|---|---|---|---|
| 2,431,326 | 11/1947 | Heyroth | 423/345 |
| 3,236,780 | 2/1966 | Ozarow | 423/345 |
| 3,343,920 | 9/1967 | Lowe | 423/345 |
| 3,348,915 | 10/1967 | Watson et al. | 423/345 |
| 3,459,504 | 8/1969 | Bracken et al. | 423/345 |
| 3,503,717 | 3/1970 | Wilson et al. | 156/610 |
| 3,663,722 | 5/1972 | Kamath | 423/345 |
| 3,758,672 | 9/1973 | Lewis | 423/345 |
| 3,927,181 | 12/1975 | Niimi et al. | 423/345 |
| 4,147,572 | 4/1979 | Vodakov et al. | 423/345 |
| 4,153,527 | 5/1979 | Greenwald | 423/345 |
| 4,166,841 | 9/1979 | Noakus et al. | 423/345 |
| 4,265,843 | 5/1981 | Dias et al. | 423/345 |
| 4,424,193 | 1/1984 | Koyama et al. | 422/248 |

FOREIGN PATENT DOCUMENTS

| | | | |
|---|---|---|---|
| 2909104 | 9/1979 | Fed. Rep. of Germany | 423/345 |
| 1563377 | 4/1969 | France | 423/345 |
| 7002110 | 8/1970 | Netherlands | 156/DIG. 64 |

*Primary Examiner*—Hiram H. Bernstein
*Attorney, Agent, or Firm*—Oblon, Fisher, Spivak, McClelland & Maier

[57] ABSTRACT

The constituent members of a semiconductor element-manufacturing apparatus which are formed by depositing a silicon carbide layer on a carbon substrate, and wherein a peak X-ray diffraction on the (200) plane of the silicon carbide layer has a half value width of 0.35° or less as measured by the $C_u$—$K_\alpha$ ray used in the X-ray diffraction analysis.

3 Claims, 7 Drawing Figures

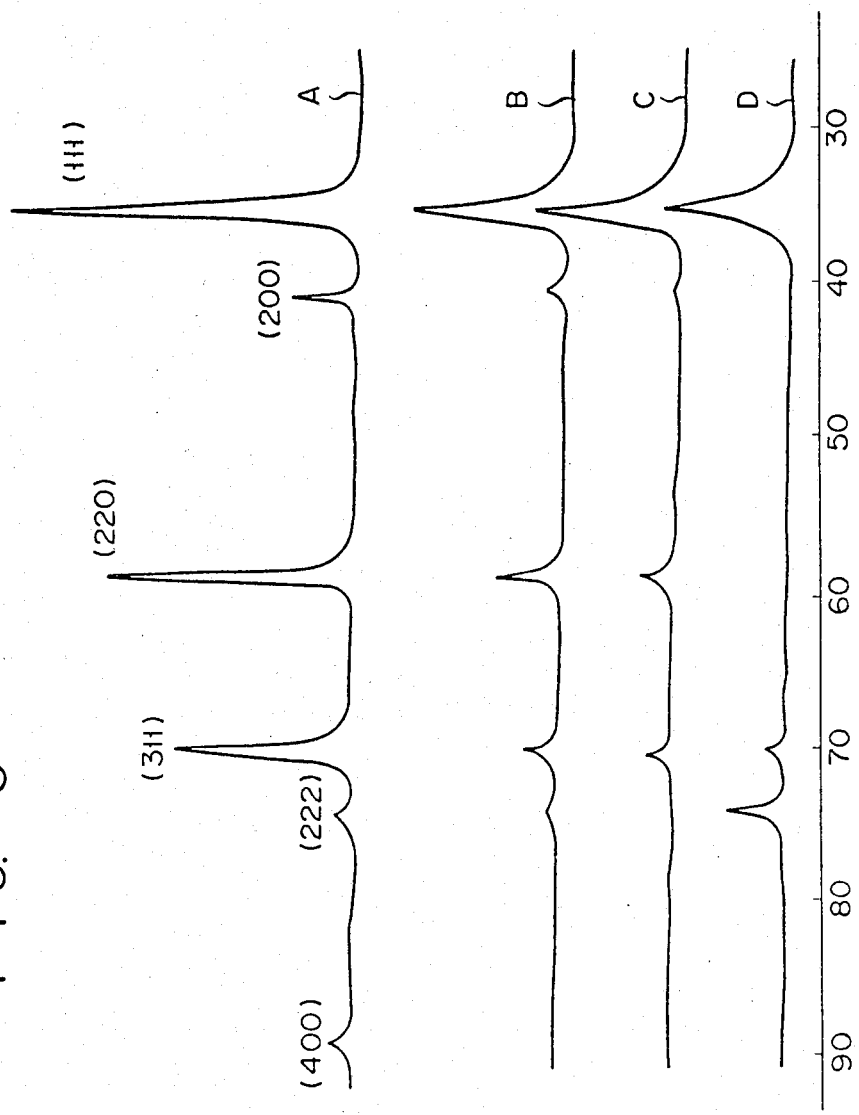
F I G. 5

CONSTITUENT MEMBERS OF A SEMICONDUCTOR ELEMENT-MANUFACTURING APPARATUS AND A REACTION FURNACE FOR MAKING SAID CONSTITUENT MEMBERS

This application is a continuation of application Ser. No. 421,025, filed Sept. 22, 1982, now abandoned which is a division of application Ser. No. 162,943, filed June 25, 1980, now U.S. Pat. No. 4,424,193.

BACKGROUND OF THE INVENTION

This invention relates to the constituent members of a semiconductor element-manufacturing apparatus such as a silicon single crystal-pulling crucible, heater, process tube and susceptor and a reaction furnace for making said constituent members.

Constuent members of a semiconductor element-manufacturing apparatus are generally known to be prepared from, for example, carbon or quartz glass. In this case, said constituent members have the surface coated, if necessary, with a silicon carbide layer by the chemical vapor deposition (CVD) method. The formation of said silicon carbide layer is intended to prevent a semiconductor material from being contaminated by undesired impurities released from a carbon or quartz glass substrate.

However, a silicon carbide layer produced by the conventional CVD method is formed, as shown in the microscopic photographs of FIGS. 1 to 3, of an agglomeration of fine crystals of silicon carbide (a scale given in the photographs represents 80 microns), which represent a low crystallinity of silicon carbide. Therefore, the silicon carbide layer prepared by the known CVD method has the serious drawbacks that the impurities of the substrate tend to pass through the boundary of silicon carbide particles, and consequently, unless the silicon carbide layer is made considerably thick, it is impossible to prevent a semiconductor material from being contaminated by the aforesaid impurities.

The carbon constituting the substrate of the respective constituent members of the semiconductor element-manufacturing apparatus has a thermal expansion coefficient of 2.5 to $5.5 \times 10^{-6}/°C$. On the other hand, a silicon carbide to be formed on said substrate has a thermal expansion coefficient of $4.2 \times 10^{-6}/°C$. Even when produced by the same process, the carbon substrate indicates considerably wide variations in properties. For example, the thermal expansion coefficient of the carbon substrate generally shows changes of about $\pm 10\%$. Therefore, it is practically impossible to establish coincidence between the thermal characteristics of the carbon substrate and those of the silicon carbide layer. In the case of, for example, a crucible, heater, process tube and susceptor which are repeatedly subjected to heating and cooling, a difference between the extent of thermal expansion of the carbon substrate and that of the silicon carbide layer readily leads to the occurrence of cracks in the silicon carbide layer, particularly when said silicon carbide layer is made considerably thick as 500 microns in order to suppress the permeation of impurities contained in the substrate through the silicon carbide layer. As a result, the effect of suppressing said permeation of impurities can not be realized at all. The growth of cracks in the silicon carbide layer during the use of the constituent members which results from a difference between the thermal characteristics of the carbon substrate and those of the silicon carbide layer is another serious drawback directly related to the contamination of a semiconductor material.

In consideration of the above-mentioned circumstances, the Japanese patent publication No. 1003 (1972) set forth the constituent members such as crucible of a semiconductor element-manufacturing apparatus in which the substrate and a layer mounted thereon were prepared from the same material to ensure coincidence between the thermal characteristics of both substrate and mounted layer. Said Japanese patent publication was intended to suppress the permeation or release of impurities in a substrate material by thermally depositing a layer of thermally decomposable graphite on the surface of a porous graplite substrate. However, said technique had the drawbacks that a layer of thermally decomposable graphite was thermally deposited on the surface of a porous graphite substrate with the axis A of the layer of said thermally decomposable graphite set parallel with the surface of the porous graphite substrate; the thermally deposited layer of said thermally decomposable graphite indicated too great an anisotropy to allow for the repetitive use of the member produced; particularly the edge portion of the thermally deposited layer of said thermally decomposable graphite began to peel even in the initial stage of application of the member, thus rendering the member substantially inapplicable; and the layer of the thermally decomposable grappite which was considerably soft was ready to be mechanically damaged, giving rise to the occurrence of pinholes.

The Japanese patent publication No. 26,597 (1973) proposed an attempt to mechanically improve the adhesivity of a silicon carbide layer to a carbon substrate. The proposed method comprised the steps of letting silicon gas flow over a carbon substrate to effect reaction between the carbon substrate and silicon, thereby forming an intermediate layer of silicon carbide (SiC) prominently adhesive to the carbon substrate; and pouring a silicon-containing gas and a carbon-containing gas, thereby forming a silicon carbide layer by the customary CVD process. However, the method of the Japanese patent publication had the drawbacks that silicon immediately reacted with carbon; consequently unless a silicon gas was let to flow over a carbon substrate uniformly and quickly, an ununiform intermediate layer of silicon resulted, presenting difficulties in effecting the uniform thermal deposition of a silicon carbide layer in the succeeding step. Therefore, the method of the above-mentioned Japanese patent publication was accompanied with rather harmful effect and failed to be put to practical use.

To date, various studies have been made on the formation of a silicon carbide layer. From the point of view that greatest importance is attached to the high purity of silicon carbide when the constituent members of a semiconductor element-manufacturing apparatus are produced, the widely accepted method of forming a silicon carbide layer includes the CVD process using starting materials of high purity, and, above all, the process which involves the following reaction systems:

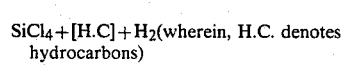 (wherein, H.C. denotes hydrocarbons)     (1)

or

     (2)

A silicon carbide layer itself thermally deposited by either of the above-mentioned processes indeed has a good purity. However, such silicon carbide layer is not yet freed of the serious drawbacks that impurities contained in a carbon substrate readily tend to permeate the silicon carbide layer on the substrate of the member; and cracks readily take place in said silicon carbide layer because of a difference between the thermal characteristics of the carbon substrate and those of the silicon carbide layer.

The most important reason why it is impossible, as previously described, to ensure coincidence between the thermal characteristics of a carbon substrate and those of a silicon carbide layer is that a starting material of carbon generally has various types and its properties are gradually shifted without definite and noticeable transistion point; and even when the same manufacturing method is applied, it is extremely difficult to produce carbon substrates having the same properties with high reproducibility. With respect to, therefore, a carbon substrate coated with a silicon carbide layer, the conventional process comprises strictly sellecting only those carbon substrates which have preferred thermal characteristics from among a large number of produced lots. To date, therefore, a carbon substrate has been manufactured with an extremely low yield, a factor of deteriorating the economic phase of producing a carbon substrate.

SUMMARY OF THE INVENTION

It is accordingly an object of this invention to provide the constituent members of a semiconductor element-manufacturing apparatus which prevent a semiconductor material from being contaminated by impurities released from a carbon substrate.

Another object of the invention is to provide the constituent members of the semiconductor element-manufacturing apparatus in which the occurrence of cracks in the silicon carbide layer of said constituent members is minimized even when said constituent members are repeatedly subjected to heating and cooling for manufacture of a semiconductor element.

Still another object of the invention is to provide a reaction furnace capable of coating the carbon substrate with a silicon carbide layer which effectively suppresses the permeation of the impurities of the carbon substrate.

To attain the above-mentioned objects, this invention provides the constituent members of a semiconductor element-manufacturing apparatus which are formed of a silicon carbide layer thermally deposited on a carbon substrate, and in which the peak X-ray diffraction on the (200) plane of said silicon carbide layer has a half value width of 0.35° or less as measured by the $C_u$—$K_\alpha$ ray used in the X-ray diffraction analysis of said silicon carbide layer. The silicon carbide constituting said silicon carbide layer has such a high crystallinity as has been unattainable by the conventional CVD method.

For the object of this invention, it is preferred that silicon carbide crystal particles whose maximum width (a maximum distance between the boundaries of the adjacent silicon carbide crystal particles) is larger than 0.15 t+5 microns (wherein t denotes the thickness of the silicon carbide layer) should occupy more than 30% of the whole polished surface of the silicon carbide layer.

BRIEF DESCRIPTION OF THE DRAWINGS

FIG. 5 shows the X-ray diffraction charts of the silicon carbide layer A of FIG. 4 embodying this invention, and the silicon carbide layers B, C, D of FIGS. 1 to 3;

DETAILED DESCRIPTION OF THE INVENTION

Figure 1:
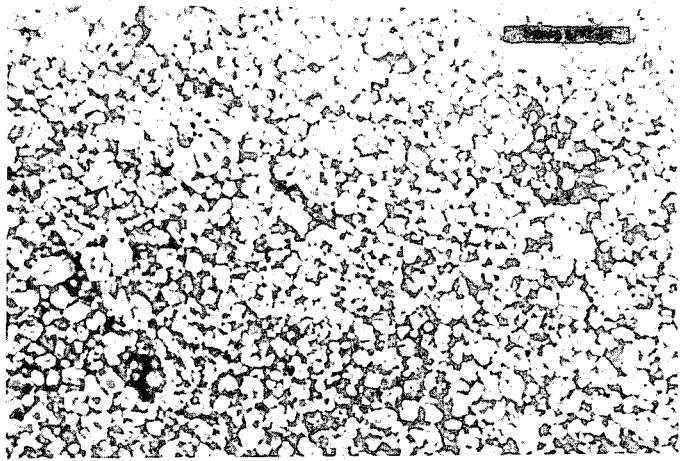
FIGS. 1 to 3 are the microscopic photographs (a scale indicated therein denotes 80 microns) of a silicon carbide layer deposited on a carbon substrate by the conventional CVD method.
Figure 4:
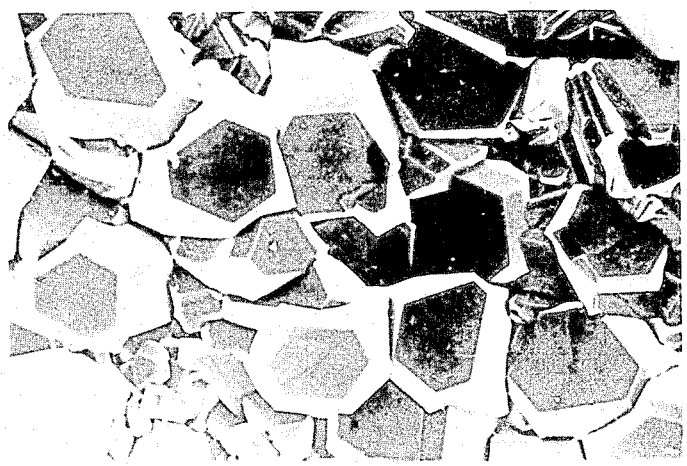
FIG. 4 is the microscopic photograph (a scale given therein represents 80 microns) of the silicon carbide layer formed on a carbon substrate by the method of this invention.
Figure 2:
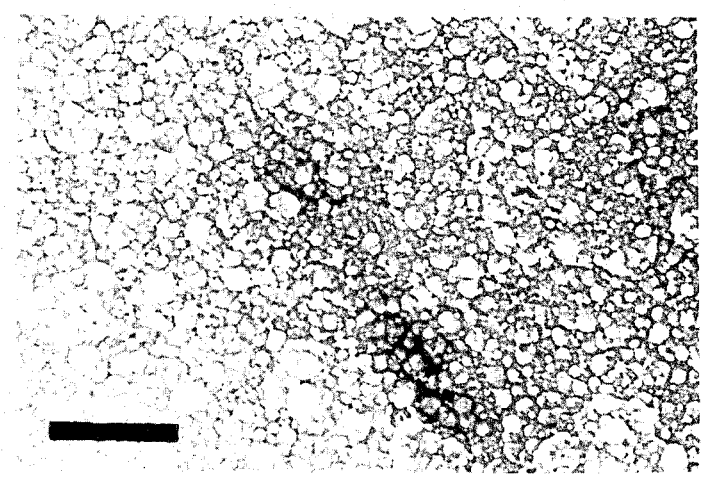
Figure 3:
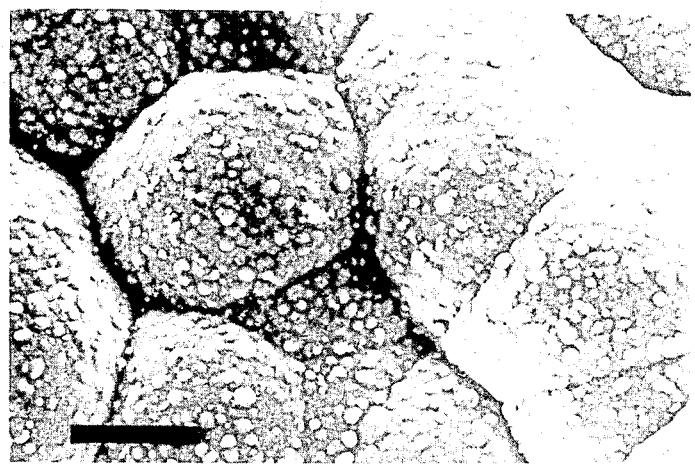

A silicon carbide layer deposited on a carbon substrate to provide the constituent members of a semiconductor element-manufacturing apparatus according to this invention is crystallized, as shown in the microscopic photograph of FIG. 4 in a far higher crystallinity than the silicon carbide layers of FIGS. 1 to 3 produced by the conventional CVD method.

X-ray diffraction analysis was carried out of the above-mentioned silicon carbide layers A, B, C, D under the following conditions:

| | |
|---|---|
| Voltage impressed on an X-ray tube | 30 KV |
| Current supplied to the X-ray tube | 20 mA |
| Scanning speed of diffraction instrument | ¼°/min |
| Running speed of recording sheet | ¼°/min |
| Inclination angle of $C_u$—$K_\alpha$ ray-generating slit | 1° |
| Inclination angle of $C_u$—$K_\alpha$ ray-introducing slit | 0.1° |
| Inclination angle of $C_u$—$K_\alpha$ ray-scattering slit | 1° |
| Range | 1 K |
| Scale | 1.0 |
| Time constant | 1 |

Figure 6:
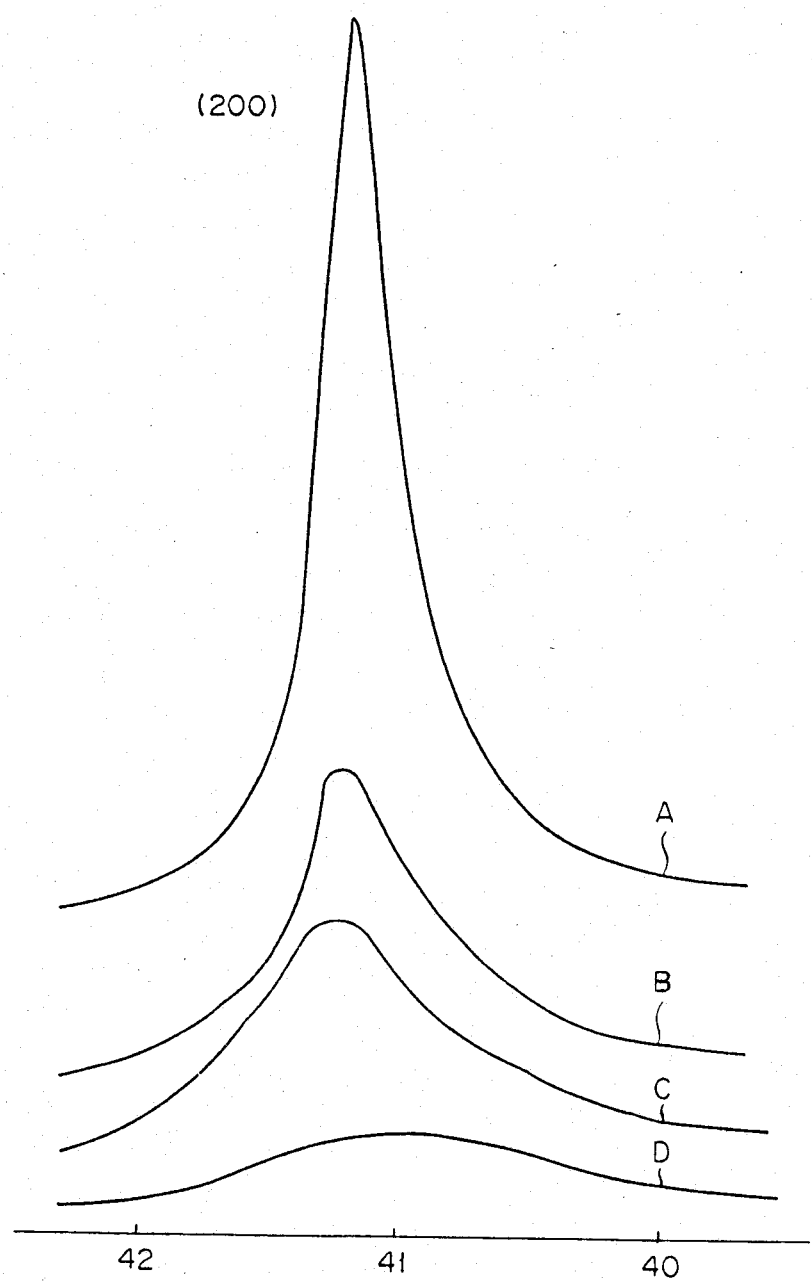
FIG. 6 indicates the enlarged X-ray diffraction charts in the proximity of the peak X-ray diffraction on the (200) plane of said silicon carbide layers A, B, C, D of FIG. 5.

As a result, the X-ray diffraction analysis produced the charts of FIG. 5. Reference numeral A of FIG. 5 denotes the X-ray diffraction chart of the silicon carbide layer of this invention whose crystal pattern is shown in FIG. 4. Reference numeral B of FIG. 5 represents the X-ray diffraction chart of the conventional silicon carbide layer whose crystal pattern is indicated in FIG. 1. Reference numeral C of FIG. 5 shows the X-ray diffraction chart of the conventional silicon carbide layer whose crystal pattern is set forth in FIG. 2. Reference numeral D indicates the X-ray diffraction chart of the conventional silicon carbide layer whose crystal pattern is given in FIG. 3. Measurement was made of the half value widths of the peak X-ray diffraction on the (200) plane of the respective silicon carbide layers A, B, C, D from the peak X-ray diffraction patterns of FIG. 6 enlarged from those of FIG. 5. The silicon carbide layer of this invention denoted by the reference numeral A of FIG. 6 have a half value width of 0.33°. In contrast the conventional silicon carbide layer represented by the reference numeral B of FIG. 6 had a half value width of 0.45°. The conventional silicon carbide layer shown by the reference numeral C of FIG. 6 had a half value width of 0.93°. It was practically impossible to determine the half value width of the conventional silicon carbide layer indicated by the reference numeral D of FIG. 6. In other words, the silicon carbide layer of this invention denoted by the reference numeral A had an extremely small half value width as measured on the (200) plane. Where the silicon carbide layer of the invention indicated a smaller half value width than 0.35° as measured on the (200) plane, then the silicon carbide layer was found to effectively prevent impurities contained in a carbon substrate from being released therefrom.

The crystal particles of a silicon carbide layer having the above-mentioned property of this invention are little subject to thermal distortion W. H. Hall's formula:

$$\beta \cos \theta / \lambda = 1/\epsilon + \eta \sin \theta / \lambda$$

where:
$\beta$ = true half value width
$\theta$ = Bragg's angle
$\lambda$ = wave length of X-ray
$\epsilon$ = size of crystal particle
$\eta$ = effective distortion of a crystal lattice proves that a small half value width measured in the X-ray diffraction analysis of a crystal means a small distortion of the lattice of the crystal. In fact, even where a considerable latitude is allowed for the properties of a carbon substrate, in other words where an appreciable difference occurs between the thermal properties of a carbon substrate and those of a silicon carbide layer deposited thereon, it is possible according to this invention to reduce the occurrence of cracks and pinholes in a silicon carbide layer when the constituent members are repeatedly heated and cooled to produce a semiconductor element.

The above-mentioned W. H. Hall's formula further proves that a small half value width determined in the X-ray diffraction analysis of a crystal not only means a small thermal distortion of the lattice of the crystal but also a large size of crystal particles. In fact, crystal particles in the surface of the silicon carbide layer of this invention which have a maximum width larger than 0.15t+5 microns (t denotes the thickness in microns of the silicon carbide layer) occupy more than 30% of the polished surface of said silicon carbide layer as shown in the 250 times magnified microscopic photograph of FIG. 4. In other words, the silicon carbide layer of this invention is formed of noticeably larger crystal particles than the conventional silicon carbide layers of FIGS. 1 to 3.

The silicon carbide layer of this invention preferably has a thickness of about 20 to about 500 microns. The silicon carbide layer of FIG. 4 has a thickness of 100 microns.

Description is now given of a reaction furnace of this invention for forming a silicon carbide layer on a carbon substrate. The deposition of a silicon carbide layer is generally carried out by either of the following processes:

(1) the conventional CVD method which comprises introducing raw gases containing silicon source and carbon source into a reaction chamber and heating the charged mass at the normal or reduced pressure; and (2) when a substrate itself is prepared from carbon, a silicon gas is introduced into the reaction chamber for thermal reaction with the carbon substrate at the normal or reduced pressure.

The reaction furnace of this invention represents an improvement on the conventional method, enabling a silicon carbide layer highly crystallized as prvieously described to be deposited on a carbon substrate. The reaction furnace of the invention comprises a reaction chamber surrounded by partition walls of carbon or silicon carbide; a carbonaceous vessel placed in the reaction chamber to hold silica powder; and a heater for heating the reaction chamber. With the reaction furnace of the invention, gases of silicon source and carbon source are not introduced into the reaction chamber from the outside. Upon heating, reaction takes place between silica powder and the carbonaceous vessel holding said silica powder or between silica powder and carbon powder mixed therewith, thereby evolving a gas mainly comprising silicon monoxide in the reaction chamber. This silicon monoxide gas is brought into contact at high temperature with a carbon substrate placed in the reaction chamber. As a result, a silicon carbide layer is formed on the surface of the carbon substrate.

Figure 7:
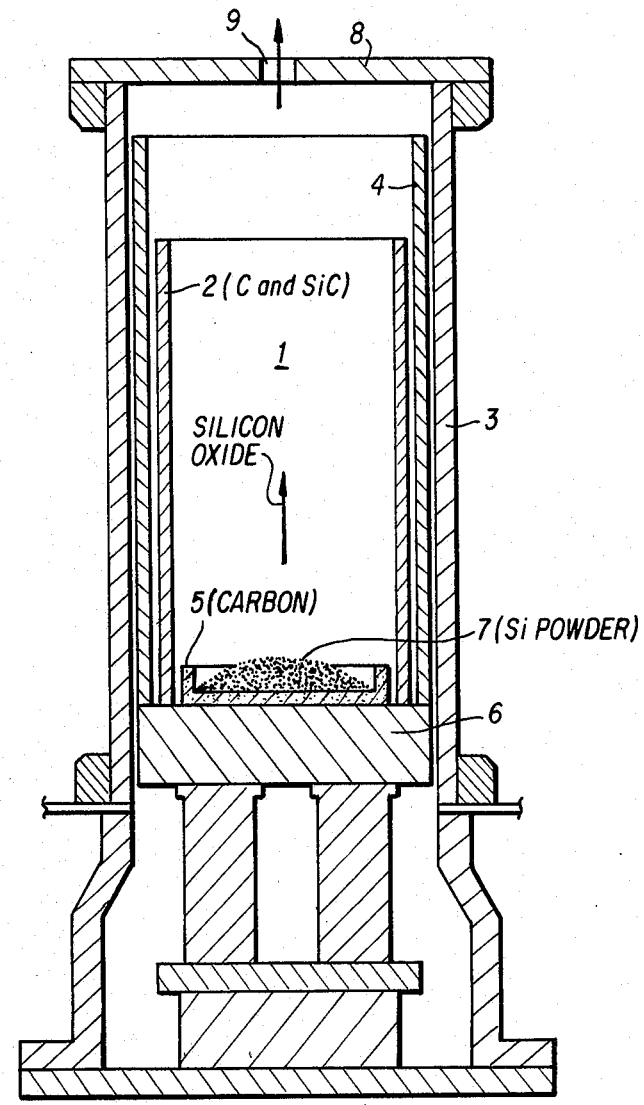
FIG. 7 is a schematic sectional view of a reaction furnace for thermally depositing a silicon carbide layer on a carbon substrate in order to produce the constitunt members of the semiconductor element-manufacturing apparatus according to the method of this invention.

Description is now given with reference to FIG. 7 of the construction and operation of a reaction furnace embodying this invention. FIG. 7 indicates the main part of the reaction furnace. This main part of the reaction furnace is set in a furnace body (not shown) formed of refractory material. The reaction chamber 1 is surrounded by a cylindrical partition wall 2 formed of carbon and/or silicon carbide. Provided outside of the cylindrical partition wall 2 is a cylindrical heater 3 for heating the reaction chamber to a temperature of 1500° to 1900° C., preferably 1650° to 1750° C. The heater 3 itself should preferably be built of carbon or silicon carbide. With the this embodiment, a second partition wall 4 is disposed between the first cylindrical partition wall 2 and heater 3. It is possible to provide such a multipartition wall or single partition wall. A carbon substrate (not shown) which is to be chemically processed is held in the reaction chamber 1 by proper engagement means provided on the innermost partition wall. A carbon vessel 5 is mounted on a rest board 6 fixed at the bottom of the reaction chamber 1. A silica powder 7, if necessary silica powder and carbon powder, is filled in said carbon vessel 5. The partition walls 2, 4 are erected on the rest board 6. The upper end of the heater 3 is covered with a water-cooled cap 8. When the partition wall protrudes from the upper end of the heater 3, then the cap 8 may be mounted on the upper end of said partition wall. The substantially central part of the cap 8 is provided with an exhaust port 9 communicating with an exhaust device (not shown), for example, a vacuum pump.

With the reaction furnace constructed as described above, a carbon substrate tube chemically processed is set in the reaction zone of the reaction chamber 1 apart from a vessel 5 holding silica powder 7, and thereafter the heater 3 is supplied with power, and a vacuum pump (not shown) is actuated. Then the carbon vessel 5 and silica powder 7 received therein are brought into contact with each other under heat, mainly evolving silicon monoxide gas. This gas is conducted into the reaction zone of the reaction chamber 1 which is kept at a temperature of 1500° to 1900° C. by the heater 3 and is decompressed to 100 to 0.1 torr by the vacuum pump.

A silicon carbide layer is chemically deposited on the surface of the carbon substrate to a considerable depth and in the highly crystallized form. Therefore, the silicon carbide layer formed by the method of this invention has the advantages that the silicon carbide layer has a high adhesivity to the carbon substrate, high crystallinity and uniform quality; even when deposited with a thickness of about 100 microns, the layer is sufficiently impervious to impurities released from, for example, a carbon substrate; the peak X-ray diffraction on the (200) plane of the layer has a small half value width; the layer is formed of large crystal particles and consequently is prominately adapted to produce the constituent members of a semiconductor element-manufacturing apparatus.

This invention will be more fully understood from the examples which follow.

EXAMPLE 1

A silicon carbide layer was deposited on the surface of a carbon substrate with a thickness of 100 microns to make four types of susceptors used in the step of epitaxial growth in the manufacture of a semiconductor element. The peak X-ray diffractions on the (200) plane of the silicon carbide layers of these susceptors respectively indicated 0.33°, 0.35°, 0.36° and 0.39° as measured by the $C_u$—$K_\alpha$ ray. A silicon layer was epitaxially grown from high purity silicon tetrachloride with a thickness of 10 microns by the hydrogen reduction method on a substrate of silicon single crystal sapported on each of the above-mentioned susceptors. The resistances of the epitaxially grown silicon layers were determined by the 4-needle method to compare the properties of the susceptors. The results are set forth in Table 1 below.

TABLE 1

| Sample No. | Half value width of peak X-ray diffraction on the (200) plane of the silicon carbide layer of each susceptor | Resistance of an epitaxially grown silicon layer |
|---|---|---|
| 1 | 0.33° | over 50 Ω · cm |
| 2 | 0.35° | over 45 Ω · cm |
| 3 | 0.36° | 20 to 35 Ω · cm |
| 4 | 0.39° | 10 to 30 Ω · cm |

As seen from Table 1 above, silicon layers epitaxially grown by means of susceptors (samples Nos. 1 and 2) whose surface was coated with a silicon carbide layer whose peak X-ray diffraction had a half value width of 0.35° and less indicated high resistance and high purity. The reason for this is that an epitaxially grown silicon layer was not contaminated by impurities contained in a carbon substrate, and the silicon carbide layer effectively prevented the impurities from being released from the carbon substrate. In contrast, silicon layers epitaxially grown by means of susceptors (samples Nos. 3 and 4) whose surface was coated with a silicon carbide layer whose peak X-ray diffraction had a larger half value width than 0.35° showed a small resistance, and were contaminated by the impurities of the carbon substrate which permeated the silicon carbide layer.

EXAMPLE 2

A silicon carbide layer was deposited on a carbon substrate with a thickness of 100 microns to make four sets of the so-called hot zone parts such as a silicon single crystal-pulling crucible, heater and heat shield. The silicon carbide layer of each member of the four sets of the hot zone parts was polished with a diamond paste until the surface of said silicon carbide layer was smoothed out. In this case, with a first set of the hot zone parts, silicon carbide crystal particles whose maximum width was over 20 microns (=0.15×100 microns (layer thickness)+5 microns) occupied 0% of the polished surface of the silicon carbide layer. With a second set of the hot zone parts, the silicon carbide crystal particles occupied 10% of the polished surface. With a third set of the hot zone parts, the silicon carbide crystal particles accounted for 30% of the polished surface. With a fourth set of the hot zone parts, the silicon carbide crystal particles accounted for 40% of the polished surface. The respective sets of the hot zone parts were used to pull up an N type silicon single crystal having a diameter of 80 mm and a specific resistivity of 20 to 25 Ω.cm. The carbon content of the respective pulled up silicon single crystals was determined in accordance with the method specified in the ASTM-F123-70T, the results being set forth in Table 2 below.

TABLE 2

| Nos. of samples of hot zone parts | Percentage areas of the polished surfaces occupied by silicon carbide crystal particles having a maximum width larger than 20 microns | Carbon content of a silicon single crystal |
|---|---|---|
| 5 | 0 | $7.2 \times 10^{16}$ atoms/cm$^3$ |
| 6 | 10 | $5.5 \times 10^{16}$ atoms/cm$^3$ |
| 7 | 30 | $1.6 \times 10^{16}$ atoms/cm$^3$ |
| 8 | 40 | $0.7 \times 10^{16}$ atoms/cm$^3$ |

Table 2 above shown that to produce a silicon single crystal having a sufficiently low carbon content for practical application, more than 30% of the polished surface of a silicon carbide layer should be occupied by silicon carbide crystal particles whose maximum width (that is, a distance between the boundaries of the adjacent silicon carbide crystal particles) is larger than 20 microns, in case the silicon carbide layer has a thickness of 100 microns. Where silicon carbide crystal particles having a maximum width larger than 20 microns occupy 0% or 10% of the polished surface of the silicon carbide layer, then the silicon carbide layer has a high carbon content, causing an impurity of carbon released from the carbon substrate to exert a harmful effect on the manufacture of a semiconductor element.

EXAMPLE 3

A silicon carbide layer was deposited with a thickness of 100 microns on four carbon boards each measuring 100×100×15 mm. The respective carbon boards were heated to 1200° C. in 5 minutes, and kept at the temperature for ten minutes, and thereafter naturally cooled to room temperature. In this spalling test, it was determined how often the carbon boards had to be repeatedly heated and cooled, before pinholes or cracks were first appeared in the silicon carbide layer deposited on the carbon boards. Table 3 below shows a number of heating-cooling cycles required for the first growth of pinholes or cracks in the silicon carbide layers, half value widths of peak X-ray diffractions on the (200) plane of the silicon carbide layers and the percentage areas of the polished surfaces of the silicon carbide layers occupied by silicon carbide crystal particles having a maximum width larger than 20 microns.

TABLE 3

| Nos. of samples of hot zone parts | Half value width of peak X-ray diffraction | Percentage areas of the polished surfaces occupied by silicon carbide crystal particles having a maximum width larger than 20 microns | Number of heating-cooling cycles required for the first growth of pinholes or cracks in the silicon carbide layers |
|---|---|---|---|
| 9 | 0.33° | 40 | 150 |
| 10 | 0.35° | 30 | 145 |
| 11 | 0.36° | 15 | 60 |
| 12 | 0.39° | 0 | 50 |

The samples Nos. 9 and 10 were shown to have an effective life 2 to 3 times longer than the samples Nos. 11 and 12.

EXAMPLE 4

A silicon carbide layer was deposited on a carbon substrate in a reaction furnace constructed as shown in FIG. 7. A carbon cylindrical partition wall 2 of the reaction furnace had an inner diameter of 80 cm and a height of 180 cm. A carbon vessel 5 was placed on a rest board 6. 2500 g of silica powder 7 was received in the carbon vessel 5. A carbon substrate was set on the partition wall 2 by means of a hook about 60 cm above the silica powder 7. The interior of a reaction chamber 1 was heated to about 1700° C. by a heater 3, kept at said temperature for 240 minutes, and also decompressed to about 0.5 torr by a vacuum pump. A silicon carbide layer was deposited on the carbon substrate with a thickness of 80 microns. The half value width of a peak X-ray diffraction on the (200) plane of the silicon carbide layer was 0.340 as measured by the $C_u$—$K_\alpha$ ray used in said X-ray diffraction analysis. A microscopic photograph shown that silicon carbide crystal particles whose maximum width was larger than 20 microns occupied 45% of the polished surface of the silicon carbide layer.

This invention produces the constituent members such as a crucible, heater and susceptor of a semiconductor element-manufacturing apparatus by depositing on a carbon substrate a silicon carbide layer which is highly crystallized and whose crystals themselves are little subject to thermal distortion. Even where, therefore, the constituent members are used at high temperature, the silicon carbide layer effectively prevents the impurities of the carbon substrate from passing through the silicon carbide layer. Even where the constituent members are repeatedly subjected to heating and cooling during the manufacture of a semiconductor element, the growth of pinholes or cracks in the silicon carbide layer can be effectively suppressed. Moreover, the silicon carbide layer tightly adheres to the carbon substrate by being deeply set therein. Through, therefore, the carbon substrate and silicon carbide layer have different thermal properties, the generation of pinholes or cracks in the silicon carbide layer can be minimized. Consequently, it is possible to apply carbon substrates falling within a broad range, regardless of a difference between their properties. a silicon carbide layer produced by this invention has the above-mentioned excellent properties. Even when therefore made considerably thinner than possible in the past, for example, deposited on a carbon substrate with a thickness of about 100 microns, the silicon carbide layer of this invention can prevent a semiconductor material or element from being contaminated by impurities released from the carbon substrate.

What we claim is:

1. A method for manufacturing a constituent member of a semi-conductor element-manufacturing apparatus, said method comprising,
   (1) placing (a) a carbon substrate of the constituent member and (b) a carbonaceous vessel containing a powder comprising silica or silica and carbon, in a reaction chamber surrounded with partition walls made of carbon, silicon carbide or a mixture thereof,
   (2) heating the reaction chamber to heat the carbon substrate, the carbonaceous vessel and the powder to a temperature of 1500° to 190° C. to cause the evolution of a gas comprising silicon monoxide and to cause a reaction between the carbon substrate and the silicon monoxide, thereby forming on at least one surface of the carbon substrate a silicon carbide layer having a half value width of 0.35° or less as measured by $C_u$—$K\alpha$ rays in x-ray diffraction analysis of the (200) plane of the silicon carbide layer.

2. The method of claim 1, wherein the heating step is carried out at a temperature of from 1650° to 1750° C.

3. The method of claim 1, wherein the reaction is carried out under an atmosphere of reduced pressure.

* * * * *